United States Patent [19]

Qamar et al.

[11] Patent Number: 5,009,765
[45] Date of Patent: Apr. 23, 1991

[54] SPUTTER TARGET DESIGN

[75] Inventors: Sohail S. Qamar, Hilliard; Harry W. Conard; Lowell E. Hamilton, both of Orient, all of Ohio

[73] Assignee: Tosoh SMD, Inc., Grove City, Ohio

[21] Appl. No.: 525,361

[22] Filed: May 17, 1990

[51] Int. Cl.$^5$ ............................................. C23C 14/34
[52] U.S. Cl. ........................... 204/298.12; 204/298.09
[58] Field of Search .................... 204/192.12, 298.09, 204/298.12, 298.19

[56] References Cited

U.S. PATENT DOCUMENTS

| | | | |
|---|---|---|---|
| 3,749,662 | 7/1973 | Biehl | 204/298.09 |
| 4,014,779 | 3/1977 | Kuehnle | 204/298.09 X |
| 4,100,055 | 7/1978 | Rainey | 204/298 |
| 4,169,031 | 9/1979 | Brors | 204/298.09 X |
| 4,324,631 | 4/1982 | Meckel et al. | 204/298.09 X |
| 4,385,979 | 5/1983 | Pierce et al. | 204/298 |
| 4,457,825 | 7/1984 | Lamont, Jr. | 204/298 |
| 4,657,654 | 4/1987 | Mintz | 204/298 |
| 4,826,584 | 5/1989 | Ribeiro | 204/298.09 |

FOREIGN PATENT DOCUMENTS

| | | | |
|---|---|---|---|
| 0215484 | 12/1984 | Japan | 204/298.09 |
| 0279672 | 12/1986 | Japan | 204/298.09 |

OTHER PUBLICATIONS

C. Elphick, "The construction . . . use", Vacuum, vol. 31, pp. 5-7, 1981.

*Primary Examiner*—Nam X. Nguyen
*Attorney, Agent, or Firm*—Biebel, French & Nauman

[57] ABSTRACT

A cathode sputtering assembly includes a sputter target welded to a corresponding backing member, where the target and backing member are adapted for insertion into a sputtering system. The target has a reduced diameter portion profiled for receipt within a counterbored upper section of the backing member. The target has a beveled surface above the reduced diameter section, and the backing member has an upper tapered edge, where the interface between the sputtering target and the backing member cooperate to define a V-groove. Both the target and the backing member are comprised of aluminum and the target and backing member are TIG welded together with aluminum filler rod.

20 Claims, 3 Drawing Sheets

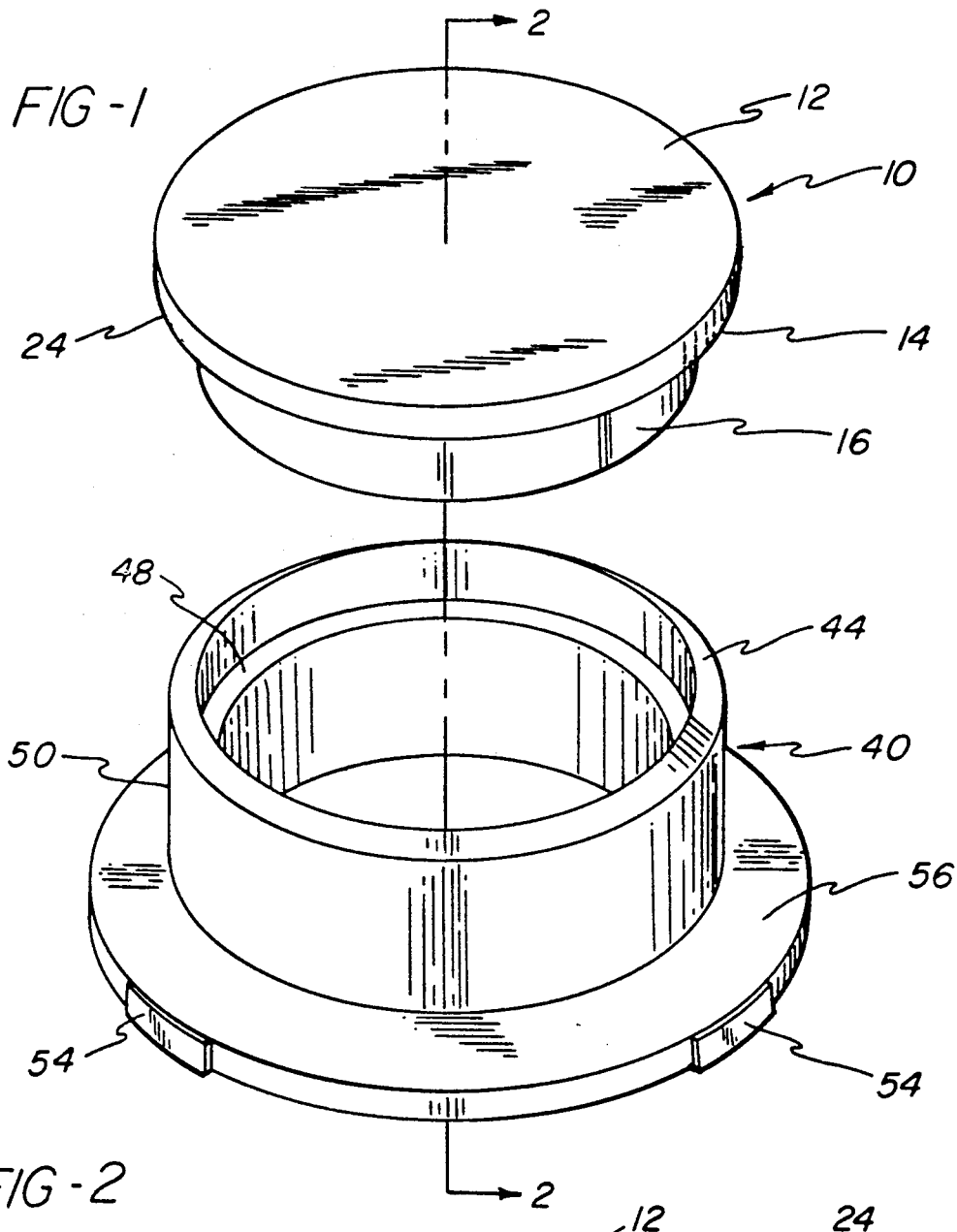

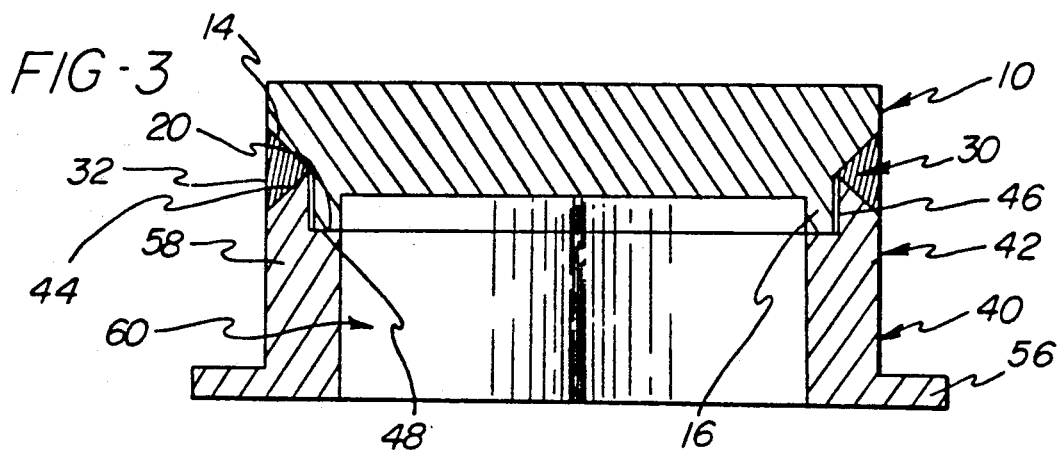
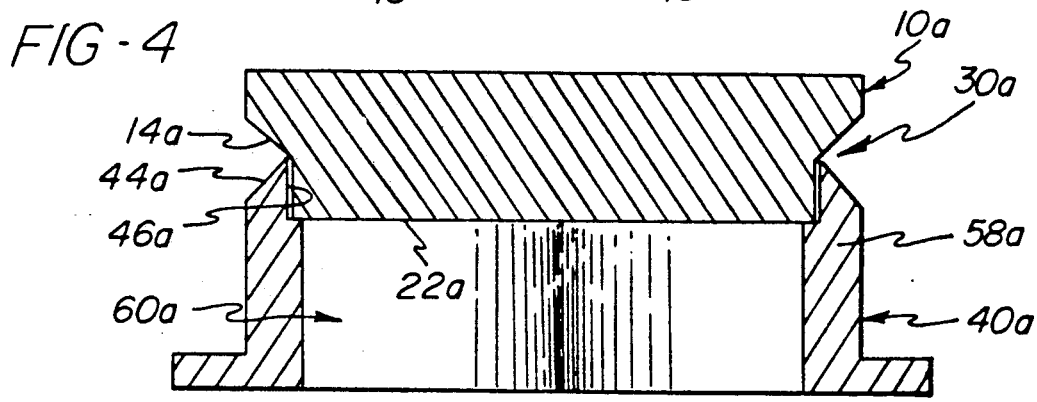
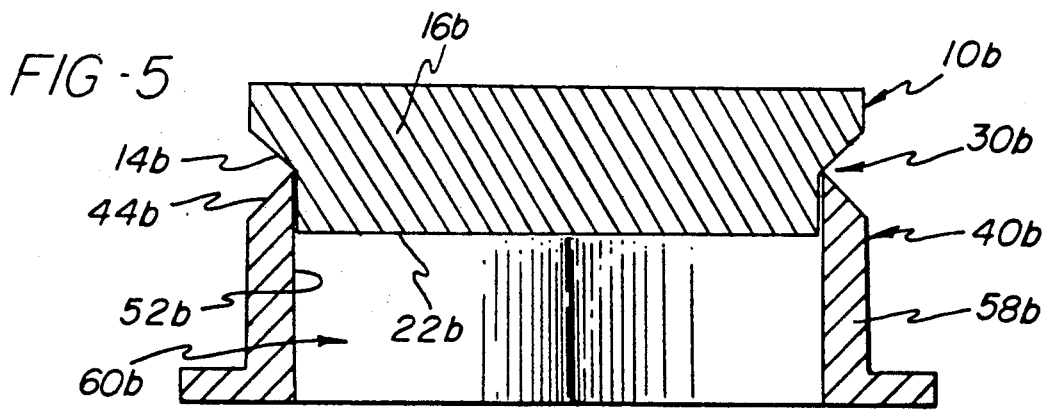
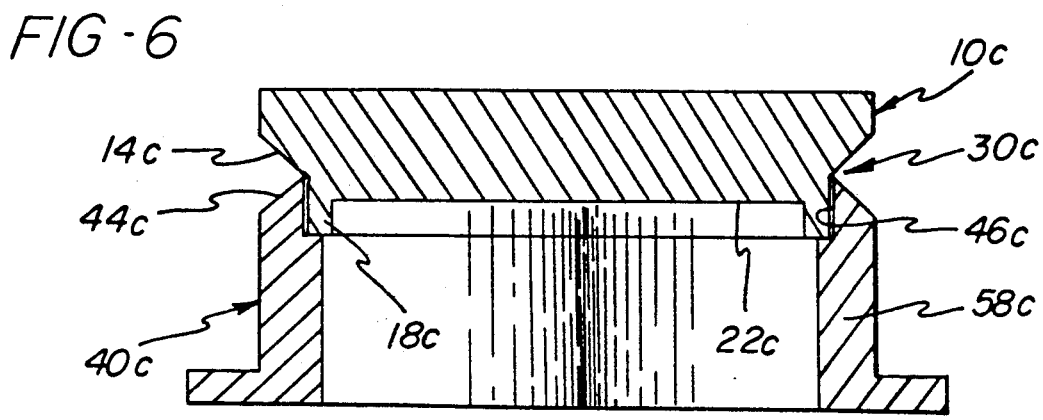

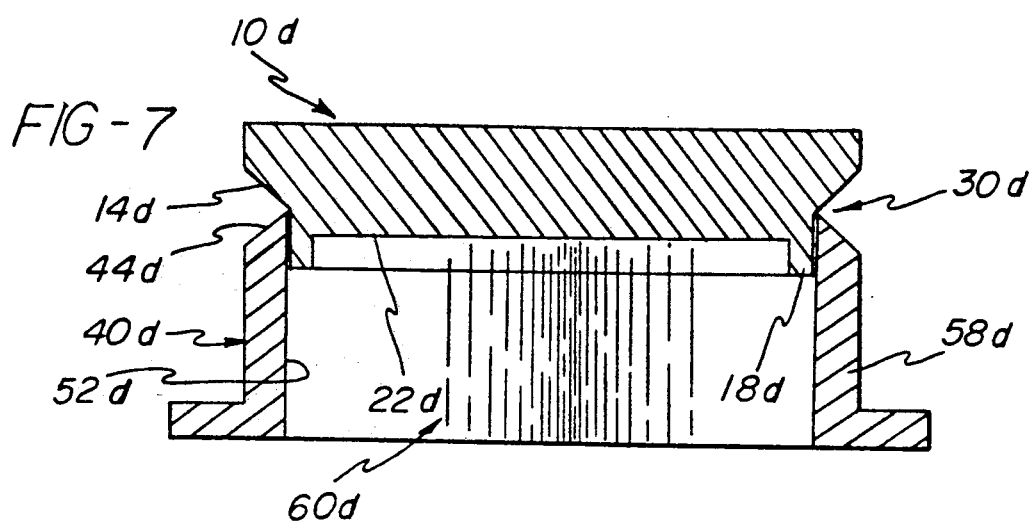
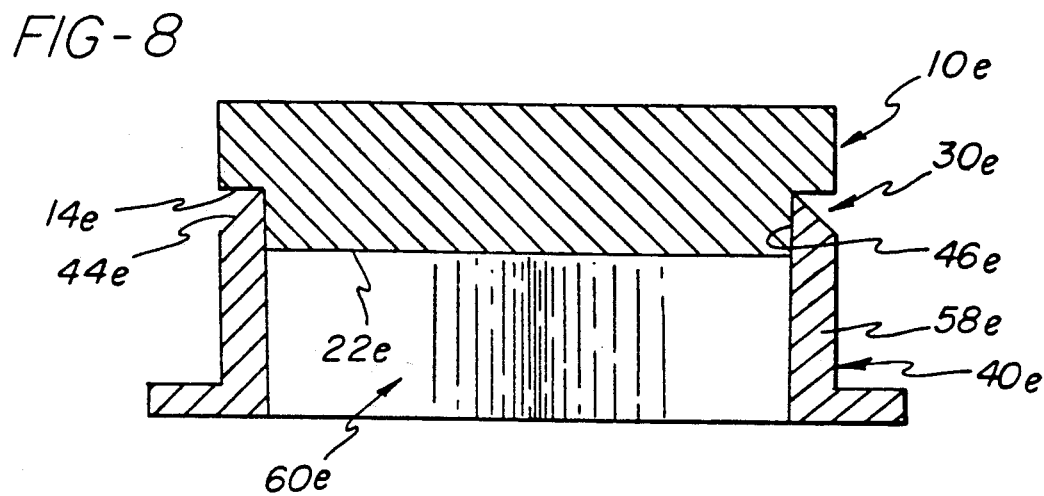
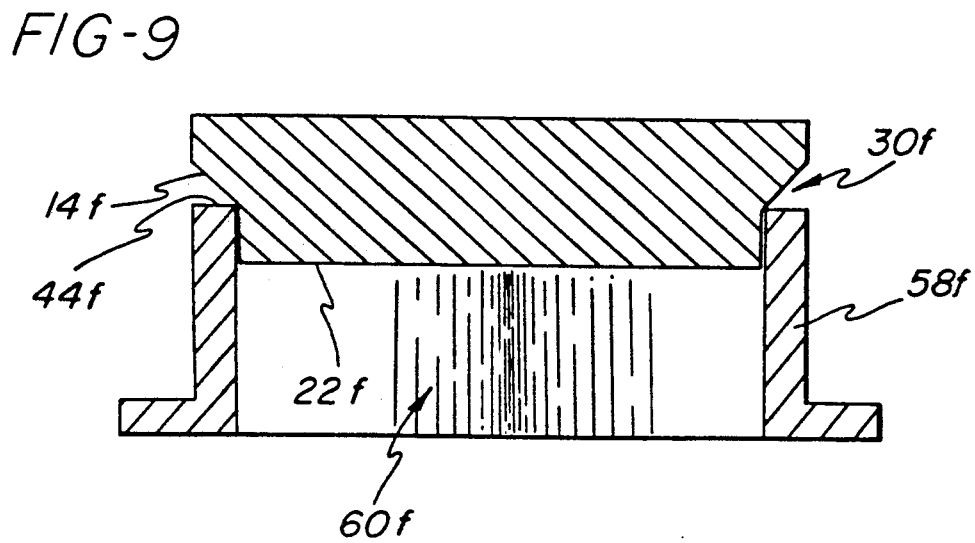

SPUTTER TARGET DESIGN

BACKGROUND OF THE INVENTION

1. Field of the Invention

The invention relates to a sputter target and backing plate assembly capable of withstanding high sputtering power levels.

2. Description of the Prior Art

Sputtering as a means to deposit thin films of a desired material on a substrate has become important in the manufacture of semiconductor devices such as integrated circuits. In a sputtering system, material to be deposited on a substrate is removed from a sputter target by bombardment of the target with ions. However, ion bombardment not only causes atoms or molecules of the target material to be ejected from the target, it also imparts thermal energy to the target.

Normally, a sputtering system comprises a sputter source, a vacuum chamber, and means for positioning and holding the substrate in proximity to the sputter source. The sputter source normally comprises a target from which material is to be sputtered, means for holding the target in place, means for creating a plasma in the vicinity of the target, means for causing ions in the plasma to bombard the target, and means for cooling the target to prevent overheating.

Various means have been used in the past for holding sputter targets in place within the sputter sources. Such holding means must insure that the target maintains good thermal contact with the cooling means. In a vacuum environment this generally requires good physical contact. On the other hand, sputter targets must be replaced from time to time as the target material is removed and the target has eroded away.

In some sputter sources, annular targets are positioned within a fixed backing plate and retained in place by various hold down features, such as retainers positioned within central openings through the target and fastened to the backing plate. In these sputter source designs, the sputtering targets are independently removable from the fixed backing plates, for replacement of the targets.

In order to cool the targets, cooling water is typically circulated through the backing plate positioned adjacent to the target. In some cases, the thermal contact between an outer rim of the target and the peripheral cooling wall is critical, and is maintained by thermal expansion of the target against the cooling wall. Examples of such sources are shown in U.S. Pat. No. 4,100,055; 4,385,979; 4,457,825 and 4,657,654.

In other versions of sputtering targets, the sputtering target is physically soldered to a backing plate, where the backing plate and the target are insertable and removable, as a unit, into and out of the sputtering system. When the target is replaced, both the spent target and the corresponding backing plate are discarded. The backing plate in such designs typically includes an upper annularly shaped planar surface adapted for flush receipt against the lower surface of the target. The backing plate further includes an annular ring extending downwardly from the planar surface having an outer mounting flange at the lower end of the annular ring.

In these sputtering designs, the targets are physically mounted to the upper surface of the planar backing plate surface, usually by a tin-silver solder film between the lower surface of the target and the planar surface of the backing plate. Cooling of the target is accomplished by circulating water into the chamber formed within the annular ring of the mounting flange, and against the lower surface of the annularly shaped planar surface of the backing plate. This particular design of sputtering target assembly has proven to have several drawbacks.

The annular planar surface portion of the backing plate usually consists of stainless steel, while the sputtering sources consist of aluminum, and thus upon heating, the backing plates and sputter sources have different thermal expansion rates. These dissimilar expansion rates cause thermal stresses at the solder joint and some may fail due to the shear stress caused by the thermal distortion.

It is also common now, to operate these sputtering targets at higher sputtering power levels, in the range of 20-25 KW of sputtering power, in order to achieve high sputtering deposition rates. At these high power levels, the targets are overheated, and melt the solder joint between the targets and the backing plates, causing failures in the sputtering target equipment, resulting in needless downtime of the equipment.

These assemblies are overheating due to the high sputtering power levels at which the sputtering targets are operating, and due to the inadequate cooling capacity of the assemblies. The stainless steel backing plate between the cooling water and the target assembly, increases the resistance of heat transfer, between the heated target and the cooling water, preventing an adequate cooling of the target, required for such high sputtering power levels.

Accordingly, it is an object of the invention to design a sputtering target and backing plate combination which can be operated at higher sputtering power levels.

It is a further object of the invention to design a fixed interconnection between a sputter source and backing plate, having improved heat transfer capabilities.

It is a further object of the invention to design a sputter source and backing plate combination having lower thermal stresses.

Other objects and advantages of the invention will be apparent from the following description, the accompanying drawings and the appended claims.

SUMMARY OF THE INVENTION

The above mentioned objects are accomplished by providing improvement in a sputtering target assembly, where the assembly comprises a sputter target having an upper surface carrying the material to be sputtered, outer side surfaces and a lower cooling surface adapted for contact with the cooling medium, water. A backing means is included which comprises an upper mounting section positioned adjacent to the sputtering target, where together the backing means and lower cooling surface of the target define a chamber for flow of cooling fluid therein. A recess means is formed at the interface of the sputter target and the backing means by adjoining cooperating surfaces of the sputter target and the backing means. Bonding means at least partially fills the recess means thereby fixedly securing the backing means and the sputter target together.

In the preferred embodiment of the invention, both the sputter target and the backing means are comprised of aluminum, and the recess means is defined as a V-groove formed by cooperating beveled surfaces at the outer intersection of the backing means and the target. Also preferably, the sputter target and the backing means are fixed together, by aluminum TIG welding, at the V-groove.

By welding the target to the backing plate, the target can be operated at higher sputtering powers, without melting the weld joint. As the target and backing means are both comprised of aluminum, there is no dissimilar thermal expansion between the target and the backing plate to stress the weld joint. Even if thermal stresses do occur, the weld joint is as strong as the aluminum material itself, and can therefore withstand higher thermal stresses than previous designs. Also, as the backing means and lower target surface define a cooling chamber, cooling water can directly contact the target surface, providing adequate cooling of the target during operation.

BRIEF DESCRIPTION OF THE DRAWINGS

FIG. 1 is an isometric view of the target sputtering source and backing plate.

FIG. 2 is a cross-sectional view through lines 2—2 of FIG. 1.

FIG. 3 is a cross-sectional view similar to that of FIG. 2, showing the sputtering target and backing plate in an assembled configuration.

FIGS. 4-9 are views similar to that of FIG. 3 showing alternate embodiments of sputtering target and backing plate configurations.

DETAILED DESCRIPTION OF THE PREFERRED EMBODIMENT

With reference first to FIG. 1, the sputter target is shown generally at 10 comprising an upper planar surface 12 carrying the material to be sputtered, a primary outer diameter 24 and a reduced diameter portion 16. A beveled edge 14 is continuous between the reduced diameter section 16 and the primary diameter 24. As shown in FIG. 2, the lower portion of the sputter target 10 includes a recess 28, formed by a peripheral ring 18 having an inner diameter 26 and a cooling surface 22 disposed on the back (lower side) of upper planar surface 12.

As shown in FIGS. 1 and 2, a backing member is shown generally at 40 and is defined by an annular ring 58 having an outer diameter 50 matching the outer diameter 24 of the target 10, and an inner diameter 52. As shown in FIG. 2, the backing plate 40 includes an upper mounting section 42 having an inner enlarged diameter section 46 defining an upwardly facing shoulder 48, and having an outwardly beveled surface 44. The backing member 40 further comprises a mounting flange 56 fixed to the lower portion of the annular ring 58, the flange having integral mounting lugs 54 (FIG. 1) thereon.

As shown in FIG. 3, the sputter target source 10 is profiled for receipt within the upper mounting section 42 of the backing plate with the reduced diameter section 16 adapted for receipt within the enlarged diameter section 46 with the shoulders 20 and 48 in an abutting and 44 cooperate to define a peripheral recess 30 between the sputter target 10 and the backing member 40. A chamber 60 is therefore defined between the mating sputter target 10 and backing member 40 for flow of cooling water or the like therethrough. This provides distinct advantage over prior art structures wherein cooling of the target could only be effected by indirect contact of the cooling medium through an intermediate surface, such as a stainless steel backing plate portion or the like.

In the preferred embodiment of the invention, the backing plate is comprised of a commercial purity aluminum, whereas the upper sputter target source 10 is comprised of a high purity aluminum alloy, preferably Aluminum 1%-Silicon. To interconnect the sputter target 10 and the backing plate 40 together, the recess 30 is preferably filled with 4043 aluminum filler rod through TIG welding. In the preferred embodiment (FIGS. 1-3), the diameters 16 and 46 are nearly equal to be frictionally held together. Advantageously, then the target and the backing member can be easily held together during the welding process. After the welding, the weld bead, shown at 32 in FIG. 3, is preferably surface finished, by a process such as surface grinding or polishing, to form a cylindrical configuration of a unitary diameter.

It should be understood that as assembled, the entire assembly, including the backing member 40 and the target 10, are insertable into a complementary holding fixture in the sputtering system. While not specifically shown, the sputtering system will have an opening where complementary recesses receive the mounting lugs 54, and a rotation of the assembly locks the lugs, and sputtering assembly, in place.

As described above, the assembly of the sputter target source and the backing member exhibits excellent heat transfer as the cooling water during sputtering directly contacts the cooling surface 22 of the target. As mentioned above, in previous applications, even though the sputtering target source was soldered directly to the backing plate, the backing plate was comprised of stainless steel and had an upper plate section intermediate the cooling water and the lower surface of the sputtering target source, adding further resistance to the heat transfer between the sputtering target source and the cooling water.

Moreover, as both the sputtering target source 10 and the backing member 40 are comprised of aluminum, there is no differential between the thermal expansion of the target source 10 and the backing member 40 to degrade the welded joint. Finally, with the fillet groove 30 defined by the beveled surfaces 14 and 44, the strength of the welded joint is the same as that of the base aluminum material, and therefore has a higher threshold for the shear stress.

Other configurations of targets and backing members are available. For example, in FIG. 4, the backing plate can include a planar surface 22a across the bottom of the sputter target 10a which is directly seated within a counterbore 46a of the backing member 40a. The recess 30a is defined by the beveled surfaces 14a and 44a. FIG. 5 shows a further embodiment where a target 10b includes a lower planar surface 22b, and where the outer diameter 16b of the target is profiled to fit snugly within the inner diameter 52b of the backing member 40b. A recess 30b is defined by the cooperating beveled surfaces 14b and 44b.

With reference now to FIG. 6, a sputtering target 10c includes a lower cooling surface 22c and an annular ring 18c extending from the lower surface 22c which is profiled to fit within a counterbore 46c of the backing member 40c. A V-groove 30c is defined by the cooperating surfaces 14c and 44c. As shown in FIG. 7, a sputter target 10d is similarly profiled to that shown in FIG. 6 having a lower ring 18d profiled to fit tightly directly into the inner diameter 52d of the backing member 40d. The V-groove 30d is formed by the cooperating beveled surfaces 14d and 44d.

It is not entirely necessary that the recess be a full V-groove, and as shown in FIG. 8, the cooperating surfaces 14e and 44e define a partial V-groove for receiving the welding material. FIG. 9 also shows a partial V-groove, where only the target is beveled at 14f.

Alternatively, besides welding with 4043 aluminum filler rod, the target 10 and backing plate 40 could be brazed, diffusion-bonded, soldered with high temperature solder, or explosion-bonded to the backing member, in any of the fillet groove configurations, as shown in FIGS. 3 through 9. Furthermore, while not explicitly shown the recess could be defined as a full U-shaped groove, or a partial U-shaped groove.

While the method herein described, and the form of apparatus for carrying this method into effect, constitute preferred embodiment of this invention, it is to be understood that the invention is not limited to this precise method and form of apparatus, and that changes may be made in either without departing from the scope of the invention, which is defined in the appended claims.

What is claimed is:

1. A sputter target assembly of the type wherein a cooling medium is to be provided in heat exchange relation with said target, comprising:
   a sputter target having an upper surface carrying the material to be sputtered, an outer, peripheral surface and a cooling surface;
   backing means comprising an upper mounting section positioned adjacent to the sputter target and having an outer peripheral surface, wherein the backing means and the target cooling surface, together, define a chamber adapted for reception of the cooling medium with the peripheral surfaces of the target member and the backing means nested adjacent each other to define an interface,
   recess means formed at the interface of the sputter target and the backing means along adjacent peripheral surfaces of the sputter target and the backing means, and
   metal bonding means disposed in the recess means for fixedly retaining the backing means and the sputter target together.

2. The assembly as recited in claim 1 wherein said cooling surface is disposed on the underside portion of said upper surface.

3. The assembly of claim 1, wherein said sputter target and said backing means are in partial overlapping coaxial disposition.

4. The assembly of claim 1 wherein said sputter target and said backing means are annular in shape.

5. The assembly of claim 4 wherein the recess means includes an outwardly projecting surface portion on the peripheral surface of the target.

6. The assembly of claim 5, wherein said outwardly projecting surface is frusto-conical in shape facing outwardly.

7. The assembly of claim 1, wherein said backing means is a hollow annular ring.

8. The assembly of claim 1, wherein said target and said backing member are both comprised of aluminum.

9. The assembly of claim 8, wherein said target and said backing member are welded together by aluminum filler rod at said recess means.

10. A sputtering target assembly, comprising:
    an open ended backing member having an upper edge;
    a sputter target having an upper surface carrying the material to be sputtered, the sputter target further comprising an outer diameter, the sputter target being positioned over the open ended backing member with the outer diameter of the sputter target positioned proximate to, and complementing, the upper edge of the backing member to cooperatively define a peripheral outer recess at the intersection of the backing member and the sputter target and
    metallic bonding means at least partially filling the peripheral outer recess thereby retaining the backing member and sputter target together.

11. The assembly of claim 10, wherein the sputter target and backing member are comprised of the same material.

12. The assembly of claim 11, wherein the sputter target and backing member are comprised of aluminum.

13. The assembly of claim 12, wherein the recess is filled with aluminum filler rod.

14. The assembly of claim 10, wherein the upper edge of the backing member is beveled outwardly.

15. The assembly of claim 10, wherein an outer diameter of the sputter target is beveled outwardly.

16. The assembly of claim 10, wherein the target includes a reduced diameter outer section at a lower end thereof, the reduced diameter section being adapted for receipt within an inner diameter of the open ended backing member.

17. The assembly of claim 16, wherein the open ended backing member includes an enlarged diameter inner section located on an inner diameter of the upper edge adapted for receipt of the reduced diameter section of the target.

18. A method of interconnecting a sputter target to a backing member, comprising the steps of:
    providing an upper mounting section on the backing member;
    providing an annular opening in the upper mounting section;
    providing an outer diameter on the sputter target adapted for receipt within the annular opening;
    providing a frusto-conical surface on the sputtering target above the said diameter;
    inserting the sputtering target into the annular opening, until the frusto-conical surface of the target abuts the upper mounting section of the backing member, thereby forming a recess therebetween; and
    bonding the backing member and the sputter target together at the recess, to secure the sputtering target to the backing member.

19. The method of claim 18, wherein the sputtering target and the backing member are each formed of aluminum.

20. The method of claim 19, wherein the sputtering target and the backing member are welded together at the recess.

* * * * *